United States Patent [19]

Sugiura et al.

[11] Patent Number: 5,191,513
[45] Date of Patent: Mar. 2, 1993

[54] SECURING DEVICE

[75] Inventors: Haruyuki Sugiura, Kariya; Katsumasa Takahashi, Nagoya, both of Japan

[73] Assignee: Kitagawa Industries Co., Ltd., Japan

[21] Appl. No.: 803,102

[22] Filed: Dec. 5, 1991

[30] Foreign Application Priority Data

Dec. 21, 1990 [JP] Japan .................................. 2-405162

[51] Int. Cl.$^5$ .............................................. H05K 5/00
[52] U.S. Cl. ................................... 361/399; 361/415; 361/420; 174/138 D; 24/297; 411/508
[58] Field of Search ............... 361/396, 412, 419, 420, 361/399, 415, 413, 417; 248/73; 411/508, 509, 510; 174/138 D; 403/405, 408; 24/297, 453

[56] References Cited

U.S. PATENT DOCUMENTS

| | | | |
|---|---|---|---|
| 4,470,178 | 9/1984 | Matsui . | |
| 4,604,776 | 8/1986 | Takahashi . | |
| 4,629,356 | 12/1986 | Hayashi . | |
| 4,674,910 | 6/1987 | Hayashi | 403/408.1 |
| 4,781,488 | 11/1988 | Hayashi | 403/408.1 |
| 4,901,204 | 2/1990 | Hayashi | 361/417 |

FOREIGN PATENT DOCUMENTS

| | | |
|---|---|---|
| 701402 | 5/1984 | Japan . |
| 2125878 | 3/1984 | United Kingdom . |
| 2181179 | 4/1987 | United Kingdom . |

Primary Examiner—Leo P. Picard
Assistant Examiner—Young S. Whang
Attorney, Agent, or Firm—Davis, Bujold & Streck

[57] ABSTRACT

A securing device for securing two boards firmly to one another with a predetermined distance therebetween. The securing device is integrally formed of resin and comprises a resilient reverse retention member to support a first board, a rectangular linkage member, resilient legs provided on both sides of the linkage member to engage the first board, and a support base to support a second board thereon. Characteristically provided with recesses at the foot of both widthwide sides of the linkage member, the securing device of this invention is enabled to have the advantages of both having a rectangular-shaped linkage member and an improvement in strength.

20 Claims, 9 Drawing Sheets

SECURING DEVICE

BACKGROUND OF THE INVENTION

The present invention relates to a securing device for securing two boards to one another in a spatial relationship.

Conventionally, securing devices have been used to secure chassis and printed boards of electrical equipment in electrical isolation. One such conventional securing device is mounted to a chassis by inserting its upper end portion into an aperture in the chassis and securing the printed board on the upper end portion thereof. The conventional securing device comprises a resilient reverse retention member, a linkage member and a pair of resilient legs. The resilient reverse retention member has a larger diameter than that of the chassis aperture for engaging with the outer surface of the chassis after the insertion. The linkage member extends from the center of the concave portion of the resilient reverse retention member and is inserted into the chassis aperture. Resilient legs are provided at both sides of the linkage member. These legs are resiliently deformed during insertion in the aperture and then abruptly allowed to return to their original positions engaging the chassis between the resilient legs and the resilient reverse retention member. When mounted to the chassis, the securing device secures the chassis between the resilient reverse retention member and the resilient legs. The resilient reverse retention member, snapped in place as explained above, is pressed onto the surface of the chassis and is elastically deformed. Therefore, the resilient reverse retention member can adjust to a certain range of thickness in the chassis when mounting the device securely onto the chassis. Furthermore, integrally formed on the upper portion of the linkage member is a structure for being slipped through an aperture in the printed board and supporting the printed board thereon.

The applicant invention is provided with a rectangular linkage member extending from the resilient reverse retention member so that the securing device is enabled to engage a substantially circular aperture in a chassis. In addition, the configurations of the resilient legs provided at both sides of the linkage member are substantially circular to engage a circular aperture. This coherence in shape of the linkage member and the resilient legs realizes strength equal to that of a linkage member having a large diameter. As a further advantage of applicant's invention, since the chassis has a circular aperture therein, the aperture is easy to manufacture and advantageous in the designing of circuit pattern and other boards. In contrast, the prior art securing device has a linkage member having a large circular diameter to increase strength. Since the resilient legs are provided on both sides of the large circular linkage member, an aperture in a chassis has to be elliptic, which is difficult to manufacture, and disadvantageous in designing a circuit pattern and other boards because the aperture is directional.

The prior art securing device has a substantially elliptic aperture and when vibrations are generated during transportation, the two boards (chassis and printed boards) move separately, and this has the tendency to snap the securing device out of the aperture In other cases, the prior art fails because a kinetic energy is generated intently at the base of the linkage member resulting in splits or breakage thereof Because the linkage member is different from the resilient reverse retention member in shape, the internal stress generated by resilient deformation of the resilient reverse retention member intensifies at the junction of the linkage member and the resilient reverse retention member. In addition, the vibration of the boards increases the internal stress beyond a yielding point causing failure.

SUMMARY OF THE INVENTION

Wherefore, an object of this invention is to provide a stronger securing device which solves the problems described above.

The securing device according to the present invention is fixed to a first board by inserting its upper end portion into a first aperture. By supporting a second board disposed at the other side, the securing device secures the first board and the second board with a predetermined distance therebetween. The securing device according to the present invention, comprising a resilient reverse retention member, linkage members, resilient legs, and a support base, is characterized by recesses formed on both of the widthwide sides of the rectangular linkage member attached to the resilient reverse retention member. The resilient reverse retention member is dish-shaped and resilient in its curving direction and large enough to engage with the periphery of the fixing aperture in the first board. The linkage member is a rectangular member to be inserted through the fixing aperture in the first board and extends from the center of the concave of the resilient reverse retention member. A pair of resilient legs which have stepped portion are provided on both sides of the linkage member. The stepped portions deform when the resilient legs are inserted through the fixing aperture in the first board and expand after the insertion for engaging with the first board. The support base is provided at the top of the linkage member forming a support portion for the second board. The support portion can be inserted through the fixing aperture in the first board.

The securing device is fixed onto the first board by the resilient reverse retention member and the resilient legs by inserting the securing device from the upper end potion into the aperture. Once inserted into the aperture, the resilient legs deform along the linkage member engaging the aperture. The support portion of the support base, which is at the top of the linkage member, supports the second board. The securing device thus secures the first board and the second board with a predetermined distance therebetween. When the two boards are secured, the resilient reverse retention member is deformed by the pressure from the first board. Although the deformation causes an internal stress inside the resilient reverse retention member, the recesses provided at the foot of the linkage member minimize the deformation of the rectangular linkage member. The recesses minimize the internal stress occurring at the resilient reverse retention member. Therefore, the internal stress will not increase beyond the yielding point even if additional kinetic energy is caused by vibration of the board. The securing device thus keeps securing the first board and the second board at a predetermined distance therebetween even when the boards are subjected to vibrations.

DETAILED DESCRIPTION OF THE PREFERRED EMBODIMENT

The embodiments of the securing device according to the present invention will now be described hereunder.

Embodiment 1

Figure 5:
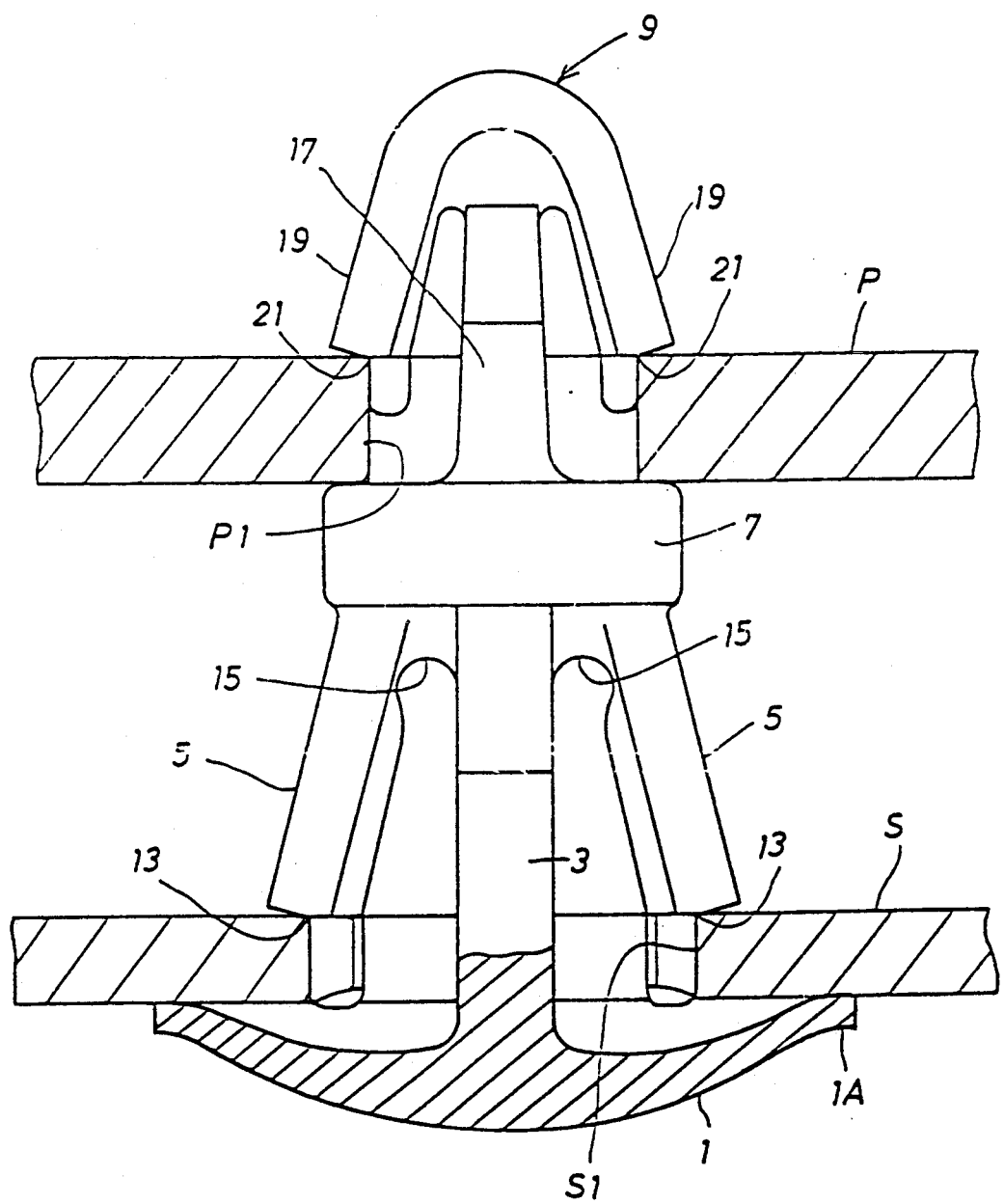
FIG. 5 is a sectional view of the securing device for the first embodiment in use.

As shown in FIG. 5, a securing device is inserted through a large aperture S1 in chassis S and into a small aperture P1 in printed board P for securing the printed board P to a chassis S with a predetermined distance therebetween. The securing device is a solid resin and comprises a resilient reverse retention member 1, a linkage member 3, resilient legs 5, a support base 7 and an upper resilient retention portion 9, as shown in an elevation view of FIG. 1, a side view of FIG. 2, and a plan view of FIG. 3. The resilient reverse retention member 1 has a thin, dish-shaped or spherical configuration and is resiliently deformable in its curving direction (the longitudinal direction of the linkage member 3). The outer diameter of the resilient reverse retention member 1 is larger than the diameter of the large aperture S1. The resilient reverse retention member 1 is thick at its center where the linkage member 3 is provided, and thin at the rim so as to be resiliently deformable. Accordingly, when in use, the resilient reverse retention member is pressed and deformed against the surface around the large aperture S1 in the chassis S, and the rim 1A of the resilient reverse retention member 1 works as a stop against the large aperture S1.

Figure 2:
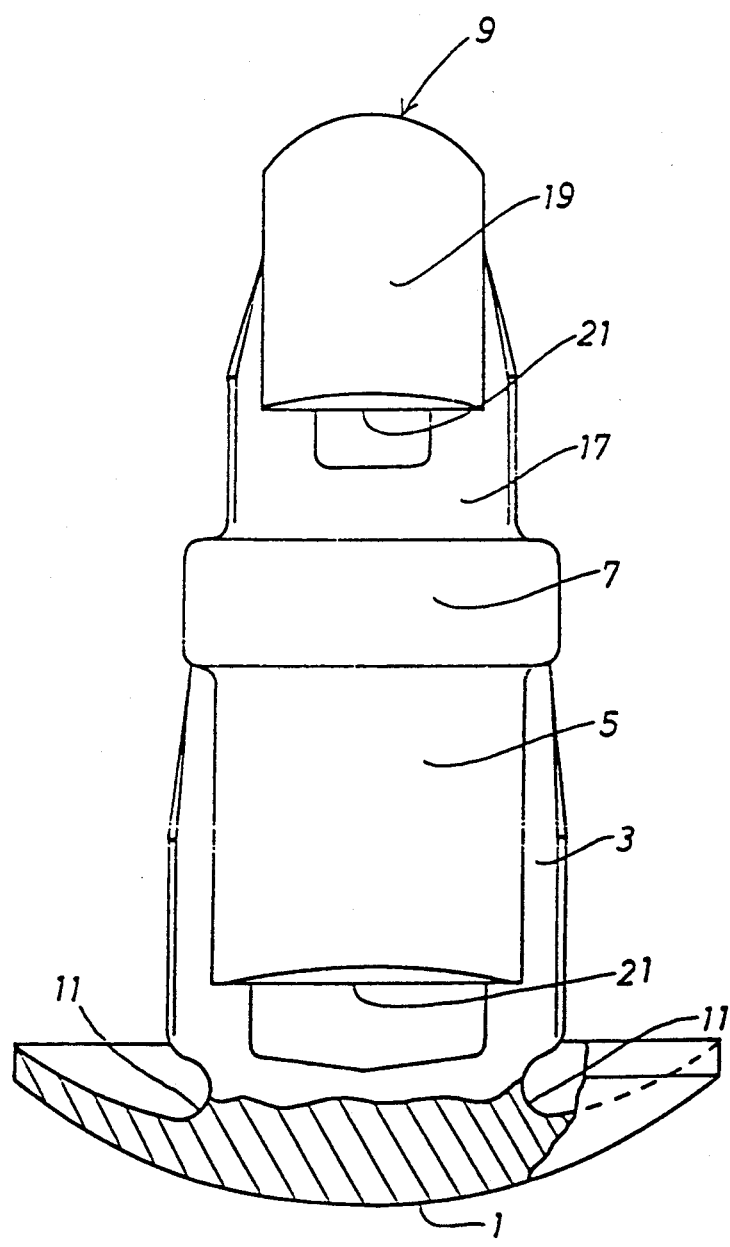
FIG. 2 is a side view of the securing device for the first embodiment.
Figure 3:
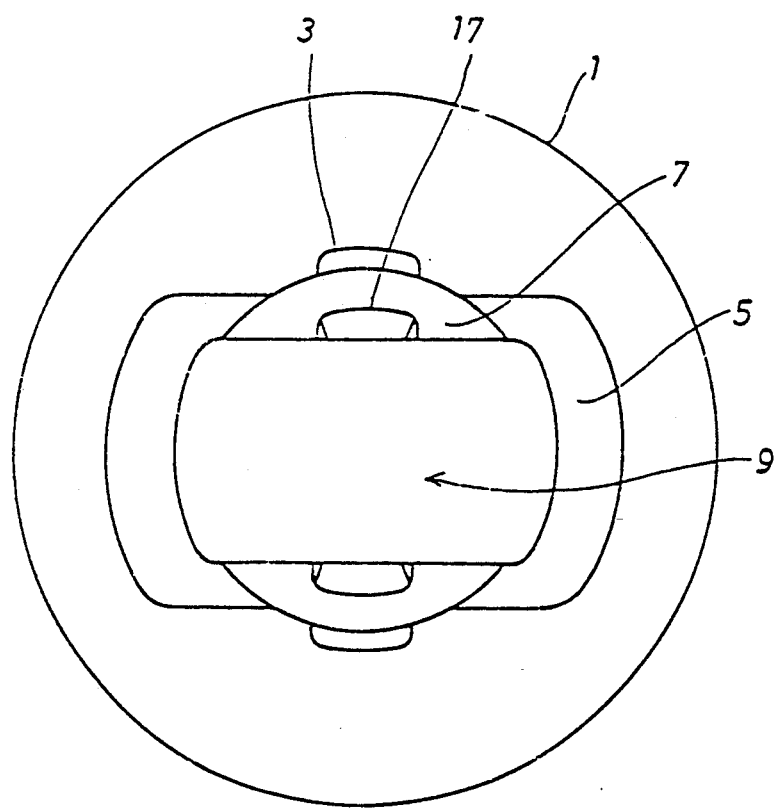
FIG. 3 is a plan view of the securing device for the first embodiment.

The linkage member 3 has a rectangular shape and extends from the center of the concave of the resilient reverse retention member The width of the linkage member 3 is smaller than the inner diameter of the large aperture S1. Recesses 11, shown in FIG. 2, are formed at the foot of both the opposed width sides of linkage member 3 on the resilient reverse retention member 1. The recesses 11 are formed smoothly and continuously to blend with the concave of the resilient reverse retention member 1.

Figure 4A:
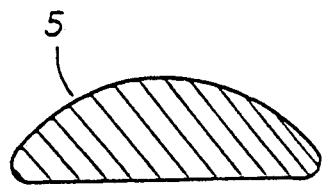
FIGS. 4A-4D are explanatory views of the securing device for the first embodiment.
Figure 4C:
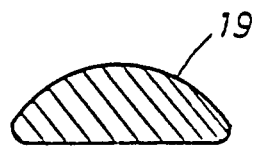
Figure 4D:
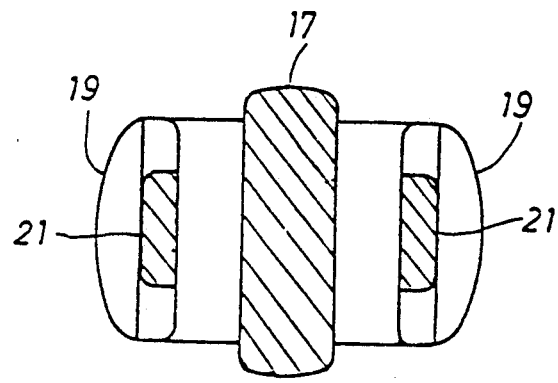
Figure 4B:
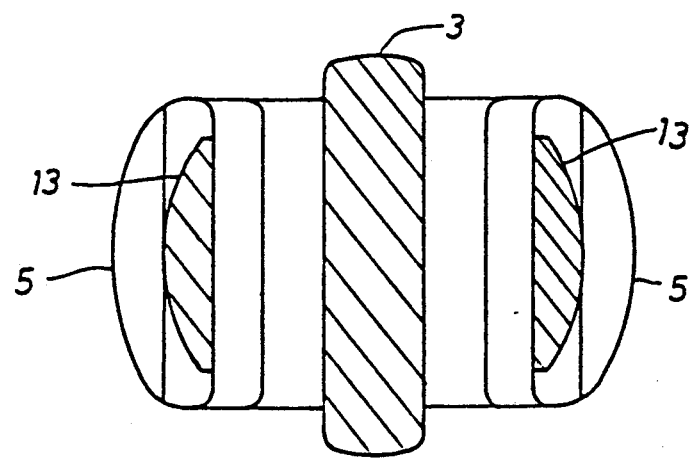

In FIG. 5, a pair of resilient legs 5 extend in a diagonal direction from the top of the linkage member 3 toward the resilient reverse retention member 1. As shown in the side sectional view of FIG. 4A, the shape of the resilient legs 5 is an arc. Stepped portions 13 in FIG. 5 are formed at the end of the resilient legs 5 for engaging with the large aperture S1 in the chassis S. As shown in the side sectional view FIG. 4B, the stepped portions 13 are curved in vertical arcs which correspond to the inner periphery of the large aperture S1. The distance between the bottom surface of the stepped portions 13 and the outer periphery of the resilient reverse retention member 1 is a little smaller than the thickness of the thinnest chassis to be put into use. The outer distance between the vertical arcs of the stepped portions 13 from one another is a little larger than the inner diameter of the large aperture S1. When deformed, the diameter of the resilient legs 5, at their ends, is smaller than the inner diameter of the large aperture S1. Therefore, when the resilient legs 5 engage with the large apertures S1 of the chassis S (as shown in the FIG. 5), resilient legs 5 are resiliently deformed to a distance approximately equal to the width of the resilient legs 5 adjacent support base 7, thereby reinforcing the support base 7 firmly. Located between the resilient legs 5 and the linkage member 3, leg recesses 15 are formed for enabling the resilient legs 5 to deform easily toward the linkage member 3 with resiliency.

The support base 7 is dish-shaped and provided vertically at the top of the linkage member 3. The outer diameter of the support base 7 is smaller than that of the large aperture S1 in the chassis S, and larger than that of the small aperture P1 in the printed board P.

The upper resilient retention portion 9 extends from the center of the support base 7. The configuration of the upper resilient retention portion 9 is similar to that of the combination of the linkage member 3 and the resilient legs 5. The upper resilient retention portion 9 comprises a second linkage member 17 and resilient arms 19. The second linkage member 17 is provided vertically at the center of the upper surface of the support base 7 and has a flat circular shape. The width of the second linkage member 17 is smaller than the inner diameter of the small aperture P1 in the printed board P.

The resilient arms 19 extend in a diagonal direction from the top of the second linkage member 17 toward the resilient reverse retention member 1. As shown in the side sectional view of FIG. 4C, each of the resilient arms 19 is arch shaped in cross section. At the ends of the resilient arms 19, upper stepped portions 21 (FIG. 5) are formed to engage with the small aperture P1 in the printed board P. As shown in the side sectional view of FIG. 4D, the upper stepped portions 21 are curved in vertical arcs which correspond to the curve of the inner periphery of the small aperture P1 in the printed board P. The distance between the bottom surface of the upper stepped portions 21 and the upper surface of the support base 7 is approximately equal to the thickness of the printed board P. The outer distance between the vertical arcs of the upper stepped portions 21 from each other is a little larger than the inner diameter of the small aperture P1. When deformed, the distance between the resilient arms 19, at their ends, is a little smaller than the inner diameter of the small aperture P1. Therefore, when in use, resilient arms 19 engage with the small aperture P1 (shown in FIG. 5) and thus the resilient arms 19 are resiliently deformed to a distance approximately equal to a minimum width of the resilient arms 19.

In order to mount the securing device described above, the upper resilient retention portion 9 of the securing device is inserted through the large aperture S1 in the chassis S. After this insertion, the linkage member 3 is inserted through the large aperture S1 causing resilient legs 5 to deform during insertion through the large aperture S1 and expand after the insertion. This process fixes the large aperture S1 between the resilient reverse retention member 1 and the stepped portions 13 of the resilient legs 5. Once inserted, the periphery 1A of the resilient reverse retention member 1 deforms resiliently and adheres to the surface of the chassis S.

With respect to the printed board P, the second linkage member 17 of the upper resilient retention portion 9 is inserted through the small aperture P1 in the printed board P. The resilient arms 19 deform during insertion through the small aperture P1 and then expand. Therefore, the small aperture P1 in the printed board P is fixed between the support base 7 and the upper stepped portions 21 of the resilient arms 19. When the securing device is fixed as described above, the printed board P is secured to the chassis S with a predetermined distance therebetween.

Although this fixation causes an internal stress in the resilient reverse retention member 1 which is pressed by the chassis S and resiliently deformed, deformation of the linkage member 3 at its foot is mitigated by the recesses 11 of the linkage member 3. In other words, the internal stress occurring at the resilient reverse retention member 1 is minimized. Accordingly, even when the chassis S or the printed board P are vibrated during transportation, generating kinetic energy and greater internal stress, this internal stress is restrained below the yielding point by the recess 11. Thus, the securing device can secure the chassis S and the printed board P firmly without the risk or failure due to internal stress.

Two comparison experiments of the strength of conventional securing device and the securing device of the first embodiment described above will now be explained.

Experiment No. 1

The strength of the securing devices was examined by pulling each of the upper resilient retention portions 9 of the securing devices forcibly toward the side of the printed board until each of the resilient reverse retention members 1 snapped out of the large aperture S1 in the chassis S. Both the securing device of the first embodiment and the prior art used in this experiment were for a printed board having a small aperture P1 of 4 mm in diameter therein and for a chassis of 1.6 mm in thickness having a large aperture S1 of 5.5 mm in diameter therein. The moisture percentage of both devices was 2.5%. The pulling speed was 20 mm/min. The resilient reverse retention member 1 of the first embodiment snapped out of the large aperture S1 in the chassis S when subjected to a force of 38 Kgf on average. On the other hand, the resilient reverse retention member 1 of the prior art device took only 17 Kgf on average to snap out of the large aperture S1 in the chassis S. It is obvious that the securing device of the first embodiment is superior to the prior art in firm fixation to the aperture. The first embodiment is superior because the resilient reverse retention member 1 of the conventional device is of uniform thinness to provide resiliency in comparison to the resilient reverse retention member of the first embodiment which is dish-shaped and concave to provide resiliency.

Experiment No. 2

In the second experiment, two steel boards were fixed to each other at four points by the securing devices therebetween and were allowed to fall due to gravity. One of the two boards was guided by a vertical guide onto a floor of steel board (20 mm in thickness) to determine the height allowable for not causing any damage to the securing devices. The device of the first embodiment and of the prior art used in this experiment were the same size as the ones used in experiment No. 1 (for the apertures of 4 mm and 5.5 mm in diameter). One of the two steel boards used for testing the first embodiment was 180 g in weight and the other was 670 g in weight. One of the two steel boards used for testing the conventional apparatus was 180 g in weight and the other was 600 g in weight. Since one of the steel boards used for the conventional apparatus is lighter than the corresponding one for the first embodiment, the conventional apparatus has an advantage under these experimental conditions. The moisture percentage for both of the securing devices was 2.5%.

Figure 1:
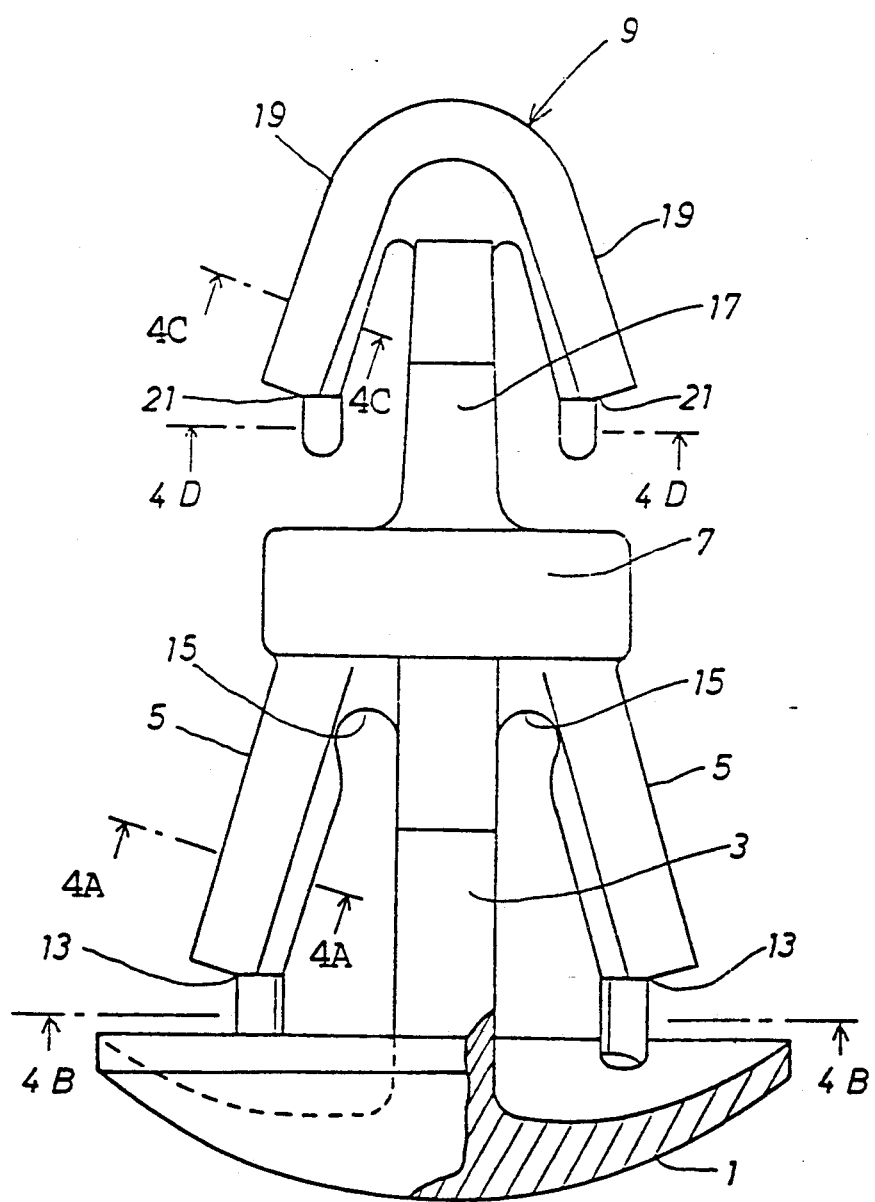
FIG. 1 is an elevation view of a securing device for a first embodiment.

When dropped from a height of 100 cm, the securing device of the first embodiment still maintained the two steel boards firmly secured without being damaged. The apparatuses were dropped in two directions A and B. The securing devices is shown in FIG. 1(revolved FIG. 5 in right angle) when dropped in the direction A. The securing devices is also shown in FIG. 2 when dropped in the direction B.

The conventional apparatus was not damaged when dropped from a height of 40 cm in the direction A, and from a height of 30 cm in the direction B. However, when the conventional apparatus was dropped from a height greater than these, at least one out of four was damaged.

Although the conventional device had an advantage in the experiment (because of the lighter steel boards, the impact force inflicted on the securing device during impact was smaller), the securing device of the first embodiment was superior as it was not damaged even when dropped from a height of 100 cm, more than twice the height of the conventional device. The superior strength of the device of the first embodiment is thus evident.

As was described above, a secure fixation of the chassis S and the printed board P with a predetermined distance therebetween can be realized with the securing device of the first embodiment which is characteristically provided with recesses 11 at the foot of the linkage member 3.

Embodiment 2

Figure 6:
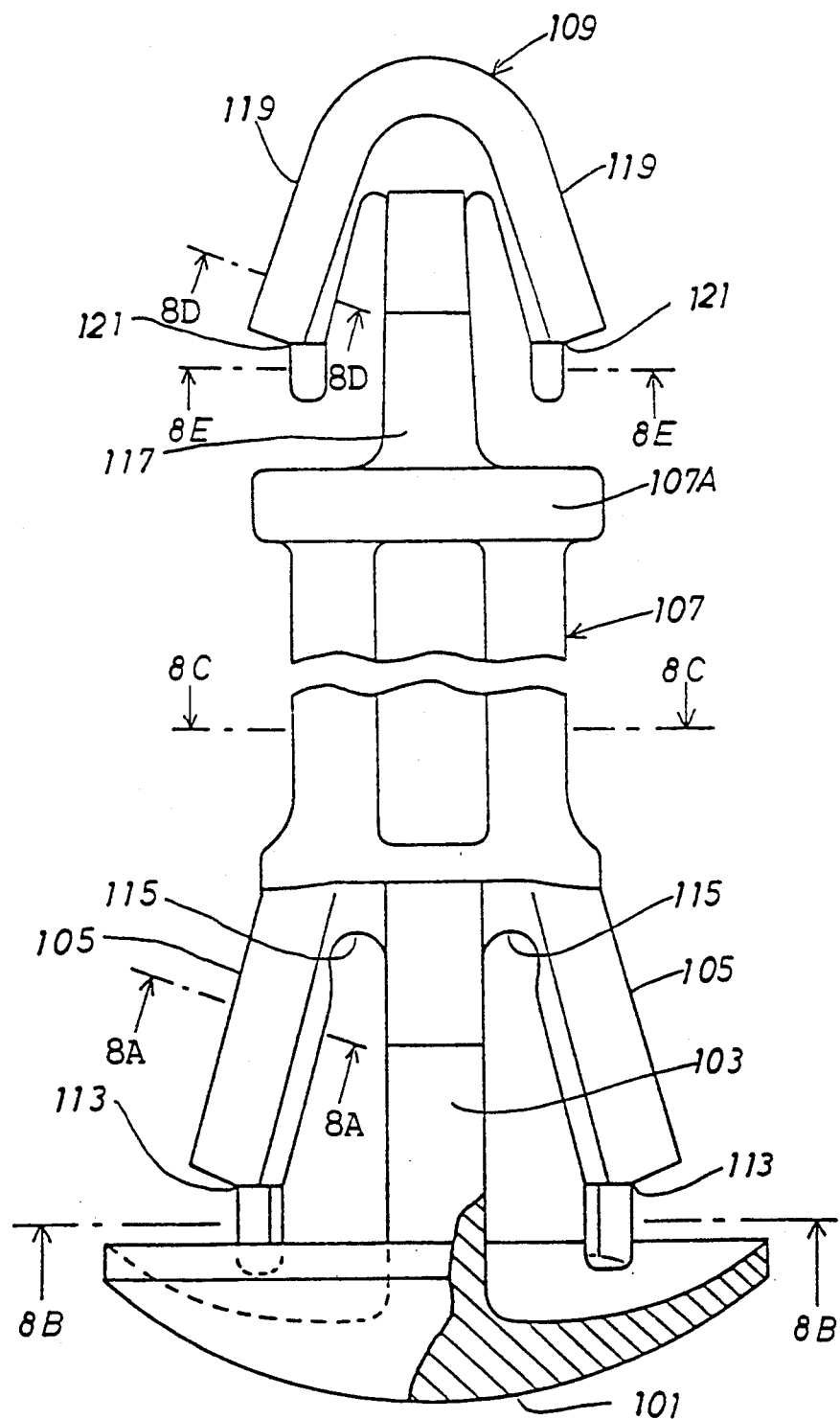
FIG. 6 is an elevation view of a securing device for a second embodiment.
Figure 7:
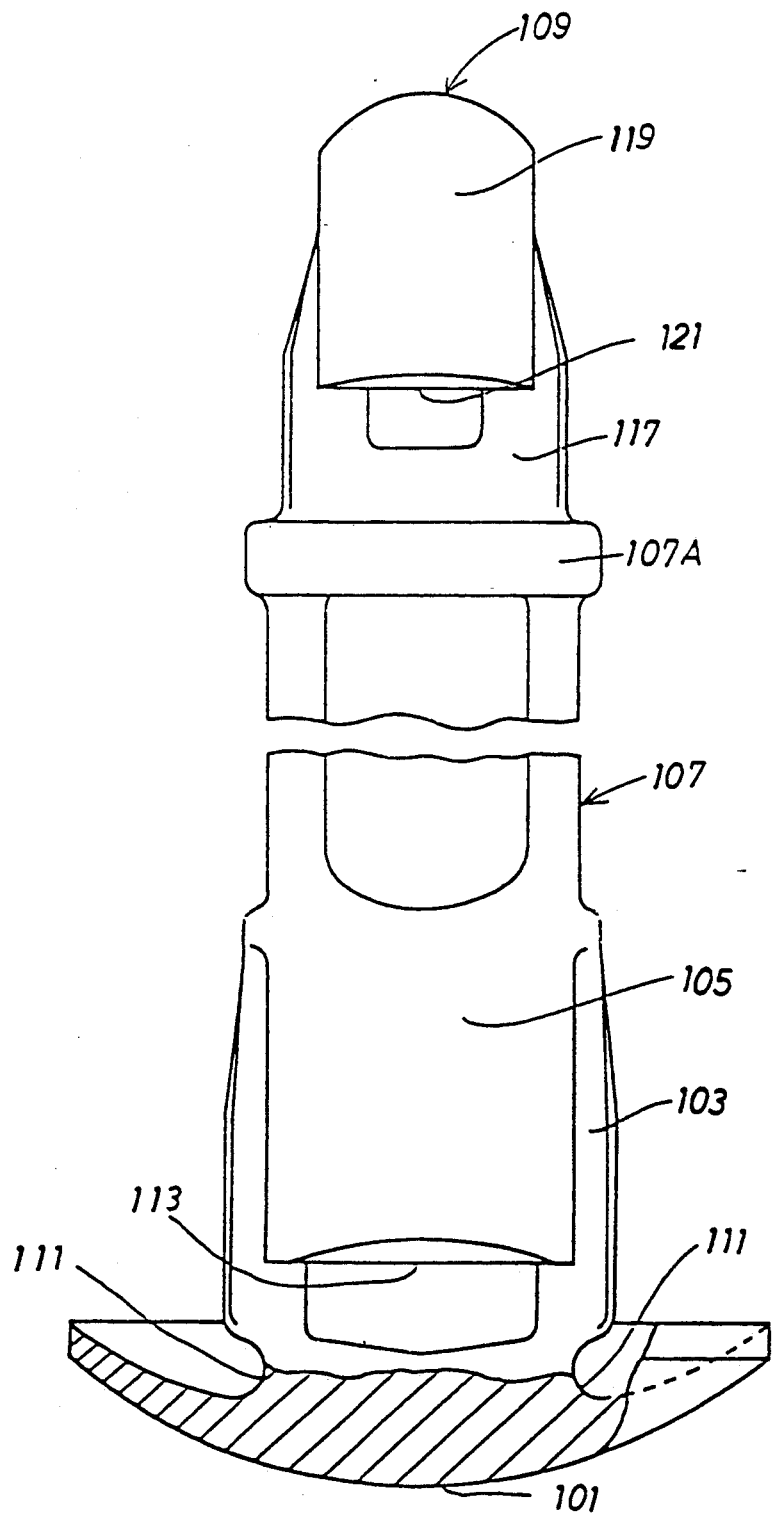
FIG. 7 is a side view of the securing device, partly in section, for the second embodiment.
Figure 9:
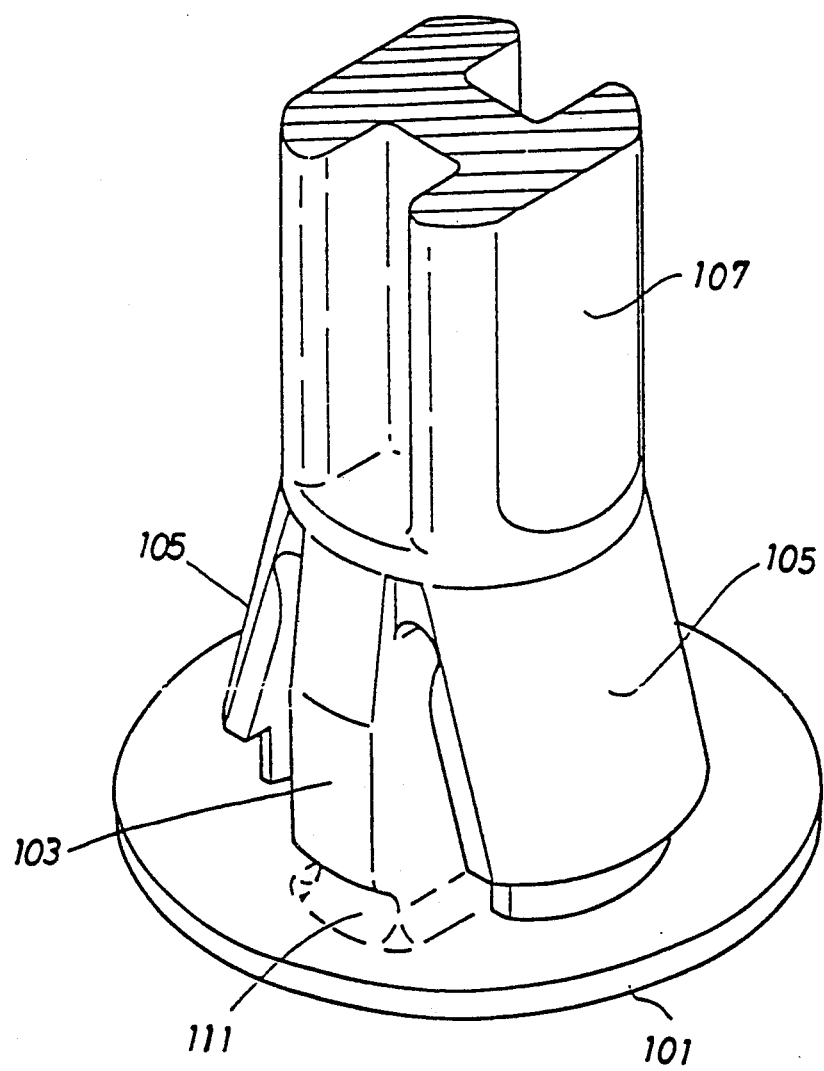
FIG. 9 is a perspective view of the securing device for the second embodiment.

Similar to the securing device explained in the first embodiment referring to FIGS. 1-5, the securing device of the second embodiment also secures the chassis S and the printed board P with a predetermined distance therebetween by being inserted through the large aperture S1 in the chassis S toward the small aperture P1 in the printed board P. This device is also a solid resin and comprises a resilient reverse retention member 101, a linkage member 103, resilient legs 105, a support base 107 and an upper resilient retention portion 109 as shown in an elevation view of FIG. 6 and in a side view of FIG. 7. The resilient reverse retention member 101 has the same construction as the resilient reverse retention member of the first embodiment. The outer diameter of the resilient reverse retention member 101 is larger than the diameter of the large aperture S1 in the chassis S. The resilient reverse retention member 101 is thick at its center where the linkage member 103 is connected and thinner at the rim so as to be resiliently deformed. The linkage member 103 has the same construction as the linkage member 3 of the first embodiment. The width of the linkage member 103 is smaller than the diameter of the large aperture S1. As shown in FIGS. 7 and 9, recesses 111 are provided at the foot of both widthwide sides of the linkage member 103 on the resilient reverse retention member 101. The recesses 111 are formed continuously to provide a smooth transition with the inner curving surface of the resilient reverse retention member 101.

Figure 8D:
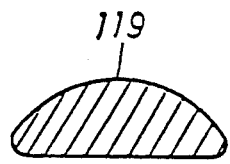
FIGS. 8A-8E are explanatory views of the securing device for the second embodiment.
Figure 8E:
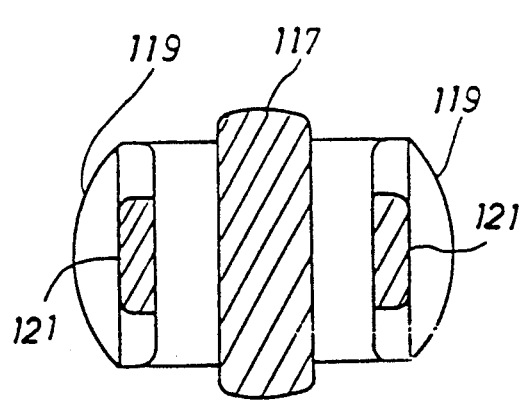
Figure 8A:
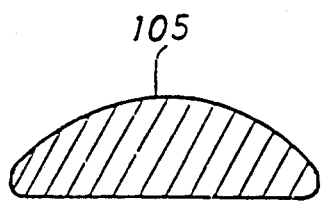
Figure 8C:
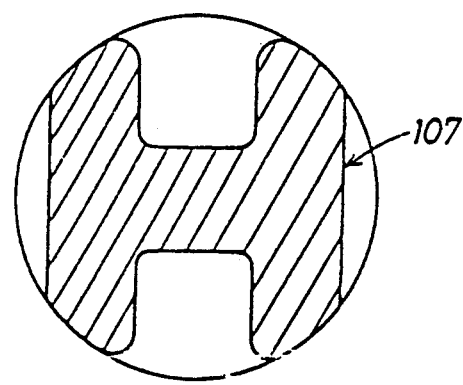
Figure 8B:
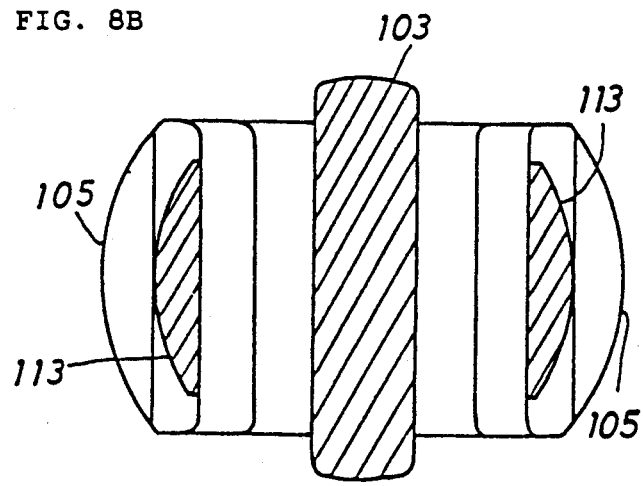

The resilient legs 105 are arch-shaped in cross section as shown in FIG. 8A and identical to the resilient legs 5 of the first embodiment. At the end of the resilient legs 105, stepped portions 113 (FIG. 6) are provided to engage with the large aperture S1 in the chassis S. As shown in the side sectional view FIG. 8B, the vertical arcs of the stepped portions 113 correspond to the inner periphery of the large aperture S1 in the chassis S. Leg recesses 115 are formed between the linkage member 103 and the resilient legs 105 enabling the resilient legs 105 to easily deform toward the linkage member 103. The support base 107 is provided on the top of the linkage member 103, and is shaped like a column. As shown in the side view of FIG. 8C, the support base 107 is a H-shaped longitudinal member. The maximum outer width of the support base 107 is smaller than the diameter of the large aperture S1 in the chassis S. The outer diameter of the supporting portion 107A at the top of the support base 107 is larger than the diameter of the small aperture P1 in the printed board P.

The upper resilient retention portion 109 is identical to the upper resilient retention portion 9 of the first embodiment, and comprises a linkage member 117 and resilient arms 119. The linkage member 117 is a flat, rectangular member extending vertically from the center of the upper surface of the support base 107. The width of the linkage member 117 is smaller that the inner diameter of the small aperture P1 in the printed board P. The resilient arms 119 extend in a diagonal direction from both sides of the top of the linkage member 117 toward the support base 107. Each of the resilient legs 119 has an arc-like configuration as shown in the side sectional view of FIG. 8D. At the end of the resilient legs 119, stepped portions 121 (FIG. 6) are formed for engaging with the small aperture P1 in the printed board P. As shown in the side sectional view of FIG. 8D, the arch shape of the stepped portions 121 enables it to be favorably engaged with the inner peripheries of the small aperture P1 in the printed board P.

Similar to the securing device of the first embodiment shown in FIGS. 1 to 5, the securing device described above is mounted by inserting the upper resilient retention portion 109 into the large aperture S1 in the chassis S. Owing to the long support base 107, the chassis S and the printed board P can be separated with relatively a larger distance therebetween. Although an internal stress occurs at the resilient reverse retention member 101 which is pressed by the chassis S and resiliently deformed, the recesses 111 of the linkage member 103 mitigate the deformation at the foot of the linkage member 103. In other words, the internal stress occurring at the resilient reverse retention member 101 is minimized. Therefore, the internal stress will not exceed the yielding point, even if kinetic energy caused by vibration of the chassis S or the printed board P in transportation increases the internal stress of the resilient reverse retention member 101. Thus, the securing device can secure the chassis S and the printed board P firmly without the risk of failure due to internal stress. In addition to the advantages of the securing device of the first embodiment, the securing device of the second embodiment can have a larger distance between the chassis S and the printed board P.

The present invention is intended to include all such modifications and alterations within the scope and spirit of the appended claims. For example, the resilient legs can not only have circular surfaces, but also a substantially four-sided figure. Moreover, the securing device can be fixed only to the first board while abutting the second board to attain the fixation of the second board.

Wherefore, having described the present invention, what is claimed is:

1. A device for securing a first board, which defines a relatively large first aperture, to a second board, which defines a relatively small aperture, in a spatial relationship, comprising:

a resilient reverse retention member being dish-shaped and having a concave inner portion which is resilient in the curved direction, said resilient reverse retention member having a diameter larger than the diameter of said first aperture to facilitate engagement adjacent a periphery of said first aperture;

a first linkage member extending from a center of the concave inner portion of said resilient reverse retention member, said linkage member having a diameter smaller than the diameter of said first aperture to facilitate passage through said first aperture;

a first pair of opposed resilient legs extending in diagonal direction from said first linkage member towards said resilient reverse retention member, said legs being resiliently deformable to allow said legs to pass through said first aperture in said first board, and said first pair of resilient legs having first stepped portions for securing said first board by resiliently engaging the periphery of said first aperture in said first board once the resilient legs have passed therethrough; and a support base connected to the first linkage member opposite of said resilient reverse retention member, said support base having means for securing said support base to said second aperture in a said second board; wherein recesses are provided in said first linkage member along at lease two opposed sidewalls of said first linkage member, adjacent said resilient reverse retention member, to reduce internal stress in the securing device and prevent stress concentration at a point where the first linkage member extends from said resilient reverse retention member.

2. A securing device as in claim 1, wherein said means for securing said support base to said second aperture comprises a second linkage member extending from the center of the support base, said linkage member having a diameter smaller than said second aperture to facilitate passage therethrough; and a second pair of opposed resilient legs extending in a diagonal direction from said second linkage member towards said resilient reverse retention member, said second pair of resilient legs having second stepped portions for securing said second board by resiliently engaging the periphery of said second aperture in said second board.

3. A securing device as in claim 1, wherein the securing device is made from a solid resin material and said first linkage member is rectangular in shape.

4. A securing device as in claim 1, wherein said first linkage member is an H-shaped longitudinal member of a desired length.

5. A securing device as in claim 1, wherein said first stepped portions are configured to engage the periphery of said first aperture after said first pair of resilient legs pass through said first aperture.

6. A securing device as in claim 2, wherein said second pair of resilient legs are resiliently deformable to pass through said second aperture, said second pair of resilient legs resiliently expand after passing through said second aperture thereby causing said second stepped portions to engage the periphery of said second aperture.

7. A securing device as in claim 1, wherein said first linkage member is a rectangular shaped member and said recesses are provided in the two opposed sidewalls defining the width of said first linkage member.

8. A device for securing a first board, which defines a first aperture, to a second board, which defines a second aperture, in a spatial relationship, comprising:
a resilient reverse retention member which is dish-shaped, an inner portion of the dish-shaped member being concave and resilient in the curved direction, said resilient reverse retention member having a diameter larger than said first aperture;
a first linkage member extending from the center of the concave portion of said resilient reverse retention member, said linkage member having a diameter smaller than said first aperture;
a first pair of resilient legs extending in a diagonal direction from said first linkage member to wards said resilient reverse retention member, said first pair of resilient legs having first stepped portions for securing said first board by resiliently engaging the periphery of said first aperture in said first board;
a support base connected to the first linkage member opposite of said resilient reverse retention member, said support base having a diameter larger than said second aperture in said second board;
means for connecting said second board to said support base; wherein
recesses are provided in said first linkage member along at least two opposed sidewalls of said first linkage member, adjacent said resilient reverse retention member.

9. A securing device as in claim 8, wherein the securing device is made from a solid resin material.

10. A securing device as in claim 8, wherein said first linkage member is rectangular in shape.

11. A securing device as in claim 8, wherein said first linkage member is a H-shaped longitudinal member of a desired length.

12. A securing device as in claim 8, wherein said first pair of resilient legs are resiliently deformable to pass through said first aperture, said first pair of resilient legs resiliently expand after passing through said first aperture thereby causing said first stepped portions to engage the periphery of said first aperture.

13. A securing device as in claim 8, wherein said recesses are located to reduce the internal stress in the securing device and prevent stress concentration at the point where the first linkage member extends from said resilient reverse retention member.

14. A method for securing a first board, which defines a first aperture, to a second board, which defines a second aperture, in a spatial relationship, by a device comprising a resilient reverse retention member being dish-shaped and having a concave inner portion which is resilient in the curved direction, said resilient reverse retention member having a diameter larger than the diameter of said first aperture to facilitate engagement adjacent a periphery of said first aperture; a first linkage member extending from a center of the concave inner portion of said resilient reverse retention member, said linkage member having a diameter smaller than the diameter of said first aperture to facilitate passage through said first aperture; a first pair of opposed resilient legs extending in a diagonal direction from said first linkage member towards said resilient reverse retention member, said legs being resiliently deformable to allow said legs to pass through said first aperture in said first board, and said first pair of resilient legs having first stepped portions for securing said first board by resiliently engaging the periphery of said first aperture in said first board once the resilient legs have passed therethrough; and a support base connected to the first linkage member opposite of said resilient reverse retention member, said support base having means for securing said support base to said second aperture in said second board; and a pair of recesses are provided in said first linkage member along at least two opposed sidewalls of said first linkage member, adjacent said resilient reverse retention member;
said method comprising the steps of:
passing said support base and said first pair of resilient legs through said first aperture and engaging said first aperture between said resilient reverse retention member and said first pair of resilient legs; and
engaging the second aperture in the second board with said means for securing said support base to secure said first board to said second board at a desired spatial relationship.

15. A method of securing a first board to a second board as in claim 14, further comprising the step of manufacturing said securing device from solid resin material.

16. A method of securing a first board to second board as in claim 14, further comprising the step of forming said first linkage member as a rectangular shaped member.

17. A method of securing a first board to a second board as in claim 14, further comprising the step of forming said first linkage member as a H-shaped longitudinal member of a desired length which at least partially determines the spatial relationship of said first and second boards.

18. A method of securing a first board to a second board as in claim 14, further comprising the step of deforming said first pair of resilient legs resiliently so as to allow them to pass through said first aperture, and allowing said first pair of resilient legs, after passing through said first aperture, to expand and cause said first stepped portions to engage said first aperture.

19. A method of securing a first board to a second board as in claim 14, wherein said means for securing said support base comprises a second linkage member extending from the center of the support base, said linkage member being dimensioned smaller than said second aperture; and a second pair of resilient legs extending in a diagonal direction from said second linkage member towards said resilient reverse retention member, said second pair of resilient legs having second stepped portions to secure said second board by resiliently engaging said second aperture in said second board, and said method further comprising the step of deforming said second pair of resilient legs resiliently so as to allow them to pass through said second aperture, and allowing said second pair of resilient legs resiliently, after passing through said second aperture, to expand and cause said second stepped portions to engage said second aperture.

20. A method of securing a first board to a second board as in claim 14, further comprising the step of locating said recesses so as to reduce the internal stress in the securing device and prevent stress concentration at the point where the first linkage member extends from said resilient reverse retention member.

* * * * *

UNITED STATES PATENT AND TRADEMARK OFFICE
CERTIFICATE OF CORRECTION

PATENT NO. : 5,191,513
DATED : March 2, 1993
INVENTOR(S) : Haruyuki SUGIURA & Katsumasa TAKAHASHI It is certified that error appears in the above-identified patent and that said Letters Patent is hereby corrected as shown below:

Column 8, line 10 after "A" insert --securing--.

Column 9, line 16 after "A" insert --securing--.

Signed and Sealed this

Sixteenth Day of November, 1993

Attest:

BRUCE LEHMAN

Attesting Officer     Commissioner of Patents and Trademarks